United States Patent
Lee et al.

(10) Patent No.: US 8,872,196 B2
(45) Date of Patent: Oct. 28, 2014

(54) CHIP PACKAGE

(71) Applicant: Xintec Inc., Jhongli (TW)

(72) Inventors: Po-Han Lee, Taipei (TW); Chien-Hung Liu, New Taipei (TW)

( * ) Notice: Subject to any disclaimer, the term of this patent is extended or adjusted under 35 U.S.C. 154(b) by 0 days.

(21) Appl. No.: 13/720,627

(22) Filed: Dec. 19, 2012

(65) Prior Publication Data

US 2013/0153933 A1 Jun. 20, 2013

Related U.S. Application Data

(60) Provisional application No. 61/577,494, filed on Dec. 19, 2011.

(51) Int. Cl.
*H01L 31/12* (2006.01)
*H01L 31/18* (2006.01)

(52) U.S. Cl.
CPC ............ *H01L 31/12* (2013.01); *H01L 31/1876* (2013.01)
USPC .............................................. 257/82; 438/25

(58) Field of Classification Search
CPC ........................... H01L 31/12; H01L 31/1876
See application file for complete search history.

(56) References Cited

U.S. PATENT DOCUMENTS

| 6,731,882 B1* | 5/2004 | Althaus et al. ................ 398/139 |
| 2009/0294779 A1* | 12/2009 | Ida et al. ......................... 257/82 |
| 2010/0022078 A1* | 1/2010 | Rockenberger et al. ....... 438/585 |
| 2013/0074764 A1* | 3/2013 | Ishihara et al. ................. 118/66 |

FOREIGN PATENT DOCUMENTS

WO  WO2009057983  * 5/2009

* cited by examiner

*Primary Examiner* — Tom Thomas
*Assistant Examiner* — John Bodnar
(74) *Attorney, Agent, or Firm* — Liu & Liu (57) ABSTRACT

An embodiment of the invention provides a chip package which includes: a semiconductor substrate having a first surface and a second surface; a sensor region formed in the semiconductor substrate; a light emitting device disposed on the second surface of the semiconductor substrate; at least one first conducting bump disposed on the first surface of the semiconductor substrate and electrically connected to the sensor region; at least one second conducting bump disposed on the first surface of the semiconductor substrate and electrically connected to the light emitting device; and an insulating layer located on the semiconductor substrate to electrically insulate the semiconductor substrate from the at least one first conducting bump and the at least one second conducting bump.

20 Claims, 7 Drawing Sheets

CHIP PACKAGE

CROSS REFERENCE TO RELATED APPLICATIONS

This application claims the benefit of U.S. Provisional Application No. 61/577,494, filed on Dec. 19, 2011, the entirety of which is incorporated by reference herein.

BACKGROUND OF THE INVENTION

1. Field of the Invention

The invention relates to a chip package, and in particular relates to a chip package formed by a wafer-level packaging process.

2. Description of the Related Art

A packaging process of chip packages is one important step in forming electronic products. A chip package not only provides protection for the chips from environmental contaminants, but also provides a connection interface for internal electronic elements of chips packaged therein.

Because the sizes of electronic products continue to shrink, it has become an important issue to form chip packages with a smaller volume and more functionalities.

BRIEF SUMMARY OF THE INVENTION

An embodiment of the invention provides a chip package which includes: a semiconductor substrate having a first surface and a second surface; a sensor region formed in the semiconductor substrate; a light emitting device disposed on the second surface of the semiconductor substrate; at least one first conducting bump disposed on the first surface of the semiconductor substrate and electrically connected to the sensor region; at least one second conducting bump disposed on the first surface of the semiconductor substrate and electrically connected to the light emitting device; and an insulating layer located on the semiconductor substrate to electrically insulate the semiconductor substrate from the at least one first conducting bump and the at least one second conducting bump.

An embodiment of the present invention provides a method for forming a chip package which includes: providing a semiconductor wafer having a first surface and a second surface, wherein a plurality of sensor regions are formed in the semiconductor wafer; disposing a plurality of light emitting devices on the second surface of the semiconductor wafer; forming an insulating layer on the first surface of the semiconductor wafer; forming a plurality of first conducting bumps on the insulating layer on the first surface of the semiconductor wafer, wherein each of the plurality of first conducting bumps is electrically connected to a corresponding one of the plurality of sensor regions; forming a plurality of second conducting bumps on the insulating layer on the first surface of the semiconductor wafer, wherein each of the plurality of second conducting bumps is electrically connected to a corresponding one of the plurality of light emitting devices; and performing a dicing process along a plurality of predetermined scribe lines of the semiconductor wafer to form a plurality of chip packages separated from each other, wherein each of the plurality of chip packages comprises at least one of the plurality of sensor regions and at least one of the plurality of light emitting devices.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to the package active or passive devices, or electronic components with digital or analog circuits, such as optoelectronic devices, microelectromechanical systems (MEMS), microfluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, microactuators, surface acoustic wave devices, pressure sensors, ink printer heads, or power IC modules.

The wafer-scale packaging process mentioned above mainly means that after the packaging process is accomplished during the wafer stage, the wafer with chips is cut to obtain separate independent packages. However, in a specific embodiment, separate independent chips may be redistributed overlying a supporting wafer and then be packaged, which may also be referred to as a wafer-scale packaging process. In addition, the above mentioned wafer-scale packaging process may also be adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

Figure 1A:
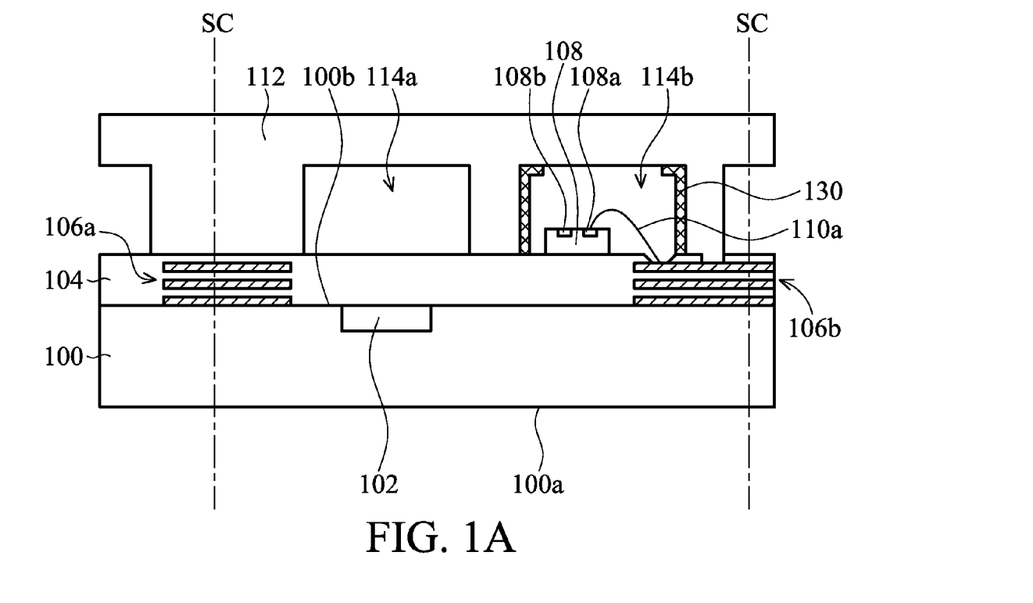
FIGS. 1A-1D are cross-sectional views showing the steps for forming a chip package according to an embodiment of the present invention.

FIGS. 1A-1D are cross-sectional views showing the steps for forming a chip package according to an embodiment of the present invention. As shown in FIG. 1A, a semiconductor substrate 100 is provided, which has a surface 100a and a surface 100b. The semiconductor substrate 100 may be, for example, a semiconductor wafer. Thus, the reference number 100 may also be used to designate a semiconductor wafer. A suitable semiconductor wafer may include a silicon wafer, silicon germanium wafer, gallium arsenide wafer, or the like.

In one embodiment, a plurality of sensor regions 102 may be formed in the semiconductor substrate 100. In addition, a plurality of predetermined scribe lines SC may be defined in the semiconductor substrate 100, which may divide the semiconductor substrate 100 into a plurality of regions, wherein each of the plurality of regions may include at least one of the plurality of sensor regions 102. The sensor region 102 may include a variety of sensor regions such as an image sensor region which may include, for example, a CMOS image sensor or the like.

In one embodiment, a dielectric layer 104 is formed on the surface 100b of the semiconductor substrate 100. A plurality of conducting pads may be formed in the dielectric layer 104, which are, for example, at least one conducting pad 106a and at least one conducting pad 106b. Each of the plurality of conducing pads (106a or 106b) may be a single layer conducting layer or a stack of a plurality of conducting layers, wherein the stacked plurality of conducting layers may be electrically connected to each other through vias (not shown) formed in the dielectric layer 104. In one embodiment, the conducting pad 106a may be electrically connected to elements in the corresponding sensor region 102. In one embodiment, the conducting pad 106b is not electrically connected to the sensor region 102. The conducting pad 106b may be used to be electrically connected to a light emitting device which is subsequently disposed.

Next, as shown in FIG. 1A, a light emitting device 108 is disposed on the dielectric layer 104 on the surface 100b of the semiconductor substrate 100. The light emitting device 108 may include, for example, a light emitting diode, organic light emitting device, polymer light emitting device, or combinations thereof. Hereafter, a light emitting diode is taken as an example to illustrate the embodiment. In this case, the light emitting device 108 may include an electrode 108a and an electrode 108b which may be a P-type electrode and an N-type electrode of the light emitting diode. In one embodiment, the electrode 108a may be electrically connected to a corresponding one of the conducting pads 106b through, for example, a bonding wire 110a. The electrode 108b may be electrically connected to another corresponding one of the conducting pads 106b through a bonding wire (not shown) or another suitable conduction route (such as a redistribution layer, not shown). In the embodiment shown in FIG. 1A, both the electrode 108a and the electrode 108b are located on an upper surface of the light emitting device 108. However, embodiments of the invention are not limited thereto. In another embodiment, both the electrode 108a and the electrode 108b may be located on a lower surface of the light emitting device 108. In this case, the electrodes of the light emitting device 108 may directly and electrically contact with the conducting pads 106b thereunder or be electrically connected to the corresponding conducting pads 106b through redistribution layers (not shown) formed on the dielectric layer 104. In another embodiment, the electrode 108a and the electrode 108b may be located on the upper surface and the lower surface of the light emitting device 108, respectively.

As shown in FIG. 1A, a transparent cover plate 112 may be optionally disposed on the surface 100b of the semiconductor substrate 100. In one embodiment, a size and a shape of the transparent cover plate 112 may be substantially similar to those of the semiconductor substrate 100. The material of the transparent cover plate 112 may be a glass, quartz, transparent polymer, or combinations thereof. In one embodiment, a light emitted by the light emitting device 108 may penetrate the transparent cover plate 112. The transparent cover plate 112 may include a plurality of protruding portions which are used to prop up against the semiconductor substrate 100 so as to surround at least two cavities 114a and 114b together with the semiconductor substrate 100. In one embodiment, the sensor region 102 may be located below the cavity 114a. In one embodiment, the light emitting device 108 may be disposed in the cavity 114b.

In one embodiment, a plurality of light shielding layers 130 may be formed on a portion of a surface of the transparent cover plate 112. The plurality of light shielding layers 130 may prevent light directly emitted by the light emitting device 108 from influencing the operation of the sensor region 102. A material which can substantially and/or completely absorb and/or reflect the light directly emitted by the light emitting device 108 may be chosen to be the material of the light shielding layer 130. In one embodiment, the material of the plurality of light shielding layers 130 may include a polymer material or a metal material. In one embodiment, the light directly emitted by the light emitting device 108 belongs to an infrared ray. In this case, a material which can substantially and/or completely absorb the infrared ray may be chosen to form the light shielding layer 130. The light shielding layer 130 may be disposed at a location between the corresponding sensor region 102 and the light directly emitted by the corresponding light emitting device 108 to prevent and/or reduce the light directly emitted by the light emitting device 108 from irradiating the sensor region 102.

Then, the semiconductor substrate 100 may be optionally thinned from the surface 100a of the semiconductor substrate 100. For example, the transparent cover plate 112 may be used as a support, and a process such as a mechanical grinding process or a chemical mechanical polishing process may be performed to the surface 100a of the semiconductor substrate 100 to thin down the semiconductor substrate 100 to a suitable thickness.

Figure 1B:
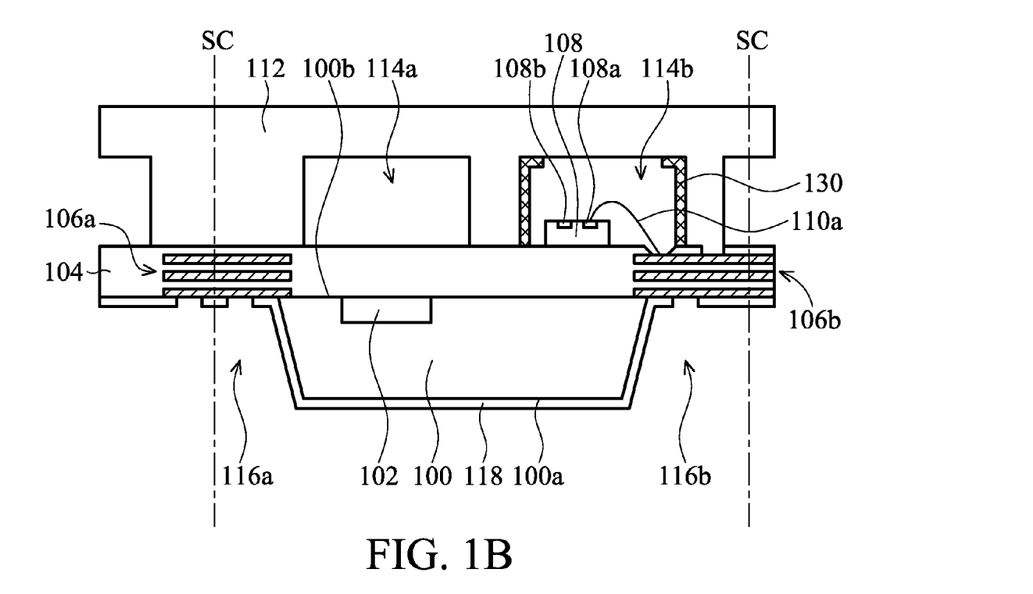

Next, as shown in FIG. 1B, a portion of the semiconductor substrate 100 is removed from the surface 100a of the semiconductor substrate 100 to form a plurality of recesses extending towards the surface 100b which may include recesses 116a and 116b. In one embodiment, a notching process may be performed from the surface 100a of the semiconductor substrate 100 along the predetermined scribe lines SC to form the plurality of recesses. In this case, the plurality of recesses 116a and 116b overlap with the corresponding predetermined scribe lines SC, respectively. The recess 116a and the recess 116b may expose the conducting pad 106a and the conducting pad 106b, respectively.

As shown in FIG. 1B, an insulating layer 118 may then be formed on the surface 100a of the semiconductor substrate 100. The insulating layer 118 may extend from the surface 100a of the semiconductor substrate 100 into the plurality of recesses (116a and 116b). The material of the dielectric layer 118 may include an epoxy resin, solder mask material, or other suitable insulating materials, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The insulating layer 118 may be formed by using a coating method, such as a spin coating, spray coating, or curtain coating method, or other suitable deposition methods, such as a liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition. Then, the insulating layer 118 is patterned to expose a portion of the conducting pad 106a and a portion of the conducting pad 106b.

Figure 1C:
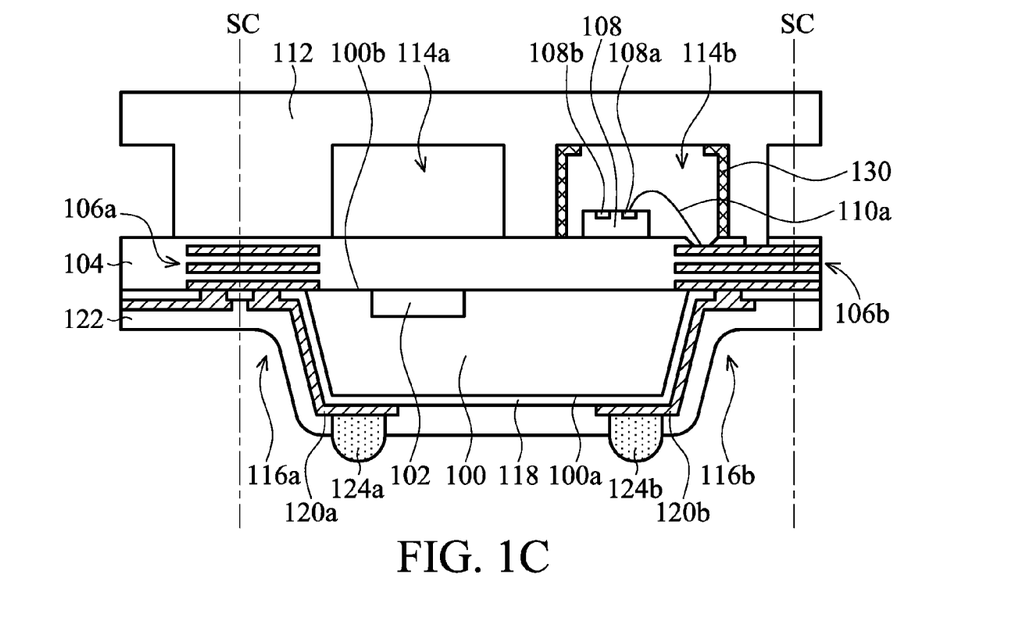

Next, as shown in FIG. 1C, at least a wire layer 120a and at least a wire layer 120b are formed on the surface 100a of the semiconductor substrate 100. The wire layer 120a may extend from the insulating layer 118 on the surface 100a of the semiconductor substrate 100 towards the surface 100b of the semiconductor substrate 100 along a sidewall of the recess 116a to electrically contact with the conducting pad 106a. The wire layer 120b may extend from the insulating layer 118 on the surface 100a of the semiconductor substrate 100 towards the surface 100b of the semiconductor substrate 100 along a sidewall of the recess 116b to electrically contact with the conducting pad 106b. In one embodiment, the materials of the wire layer 120a and the wire layer 120b may include copper, aluminum, gold, platinum, nickel, tin, or combinations thereof. The formation method for the wire layer 120a and the wire layer 120b may include a physical vapor deposition process, chemical vapor deposition process, applying process, electroplating process, electroless plating process, or combinations thereof. In one embodiment, a conducting layer may be formed on the surface 100a of the semiconductor substrate 100 and the sidewalls and bottoms of the recess 116a and the recess 116b. Then, a photolithography process and an etching process may be used to pattern the conducting layer to be the plurality of wire layers.

Then, a protection layer 122 may be formed on the surface 100a of the semiconductor substrate 100. The protection layer 122 may include a solder mask material, green paint, polyimide, or the like. The protection layer 122 may cover the plurality of wire layers. In one embodiment, the protection layer 122 may have a plurality of openings which may expose the wire layer 120a and the wire layer 120b, respectively.

Then, conducting bumps may be formed in the plurality of openings of the protection layer 122. For example, both the conducting bump 124a and the conducting bump 124b may protrude from the plurality of openings and electrically contact with the wire layer 120a and the wire layer 120b, respectively. In one embodiment, the conducting bump 124a and the conducting bump 124b may be electrically connected to the sensor region 102 and the light emitting device 108 through, for example, the plurality of wire layers (120a and 120b) and the conducting bumps (106a and 106b), respectively. The materials of the conducting bump 124a and the conducting bump 124b may include, for example, tin, lead, copper, gold, or combinations thereof.

Figure 1D:
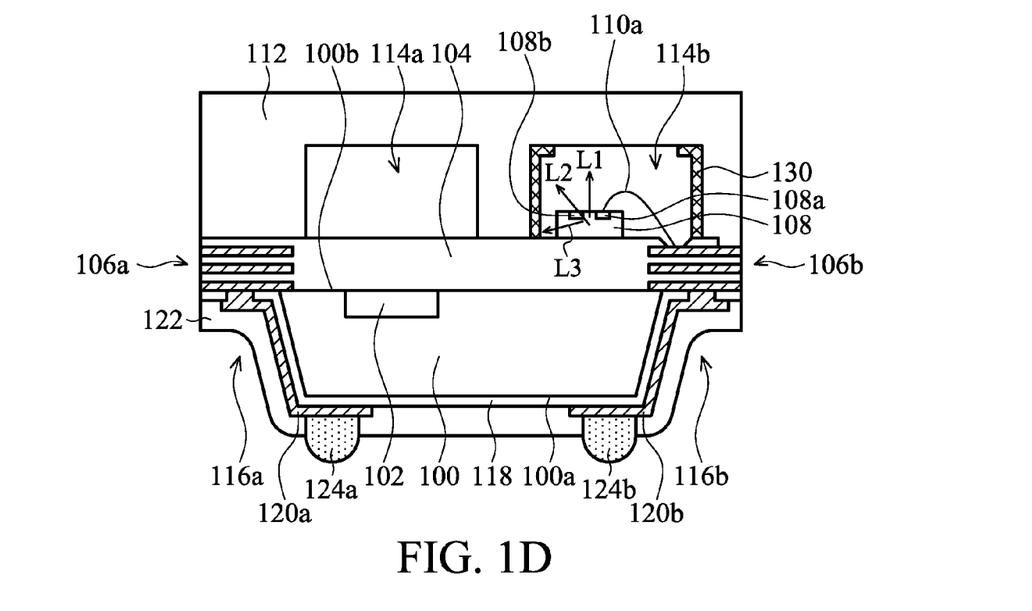

Next, as shown in FIG. 1D, a dicing process may be performed along the predetermined scribe lines SC of the semiconductor substrate 100 to form a plurality of chip packages separated from each other. In the chip package, at least a sensor region 102 and at least a light emitting device 108 are included. In this embodiment, the wire layer 120a extends from the surface 100a of the semiconductor substrate 100 towards the surface 100b along a side surface (such as the left side surface) of the semiconductor substrate 100 and electrically contacts with the conducting pad 106a to be electrically connected to the sensor region 102. The wire layer 120b extends from the surface 100a of the semiconductor substrate 100 towards the surface 100b along a side surface (such as the right side surface) of the semiconductor substrate 100 and electrically contacts with the conducting pad 106b to be electrically connected to the light emitting device 108. In this embodiment, the light emitting device 108 may be a light emitting diode and have the two electrodes 108a and 108b. As shown in FIG. 1D, the electrode 108a of the light emitting device 108 may be electrically connected to the conducting bump 124b through the bonding wire 110a, the conducting pas 106b, and the wire layer 120b. The electrode 108b of the light emitting device 108 may also be electrically connected to a corresponding conducting bump (not shown) in a similar manner.

As shown in FIG. 1D, in one embodiment, because the light shielding layer 130 is disposed between the sensor region 102 and the light (such as the light L1, L2, or L3) directly emitted by the light emitting device 108, the sensor region 102 is substantially and/or completely not irradiated with the light directly emitted by the light emitting device 108 to influence the operation of the sensor region 102. In one embodiment, when the chip package approaches a certain object, the light emitted by the light emitting device 108 may irradiate the object and be reflected to be sensed by the sensor region 102. Thus, the chip package of the embodiment may be used as a proximity sensor.

Figure 2A:
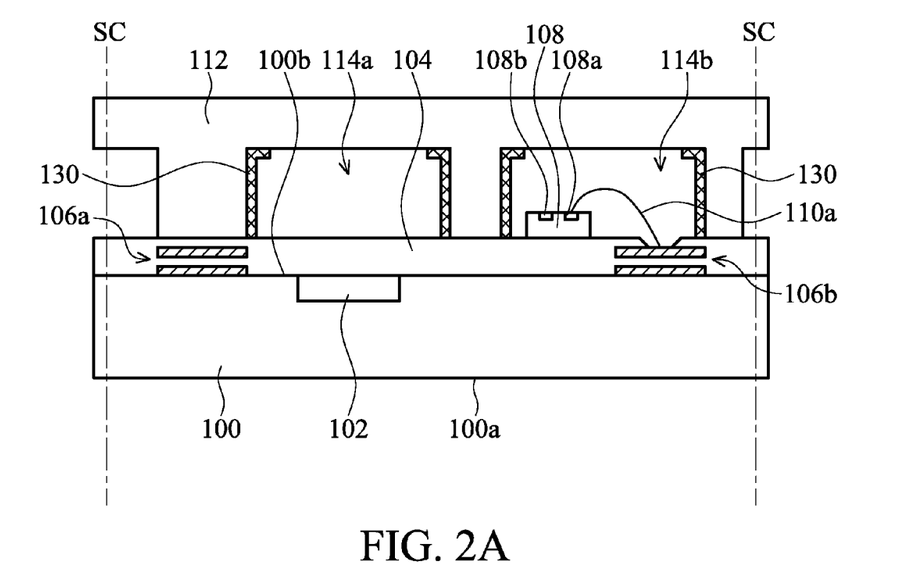
FIGS. 2A-2D are cross-sectional views showing the steps for forming a chip package according to an embodiment of the present invention.

FIGS. 2A-2D are cross-sectional views showing the steps for forming a chip package according to another embodiment of the invention, wherein same or similar reference numbers are used to designate same or similar elements. As shown in FIG. 2A, a structure similar to that shown in FIG. 1A may be provided. In addition, a light shielding layer 130 may be optionally further formed on a portion of a surface of a transparent cover plate 112 which surrounds a cavity 114a. Thus, the light emitted by a light emitting device 108 may be further reduced and/or prevented from influencing the operation of a sensor region 102.

Figure 2B:
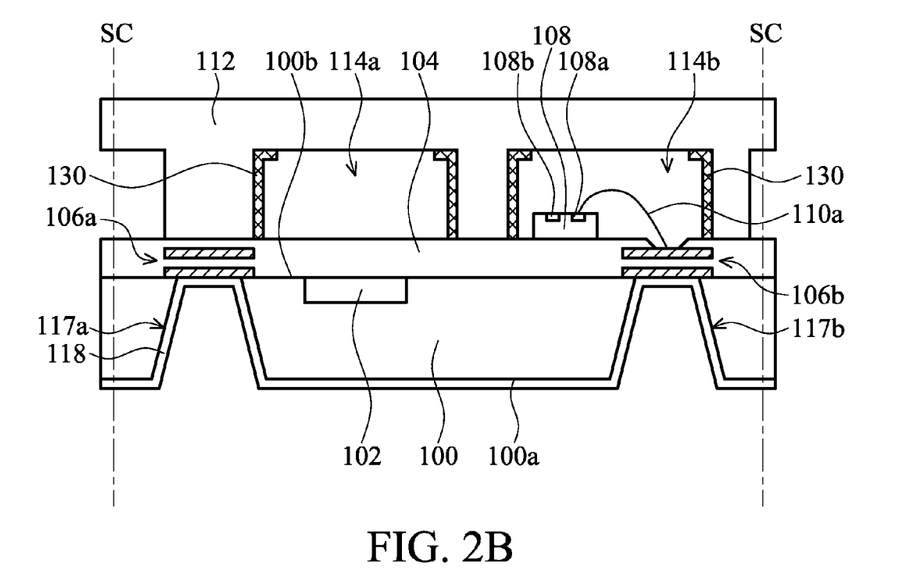

As shown in FIG. 2B, a portion of a semiconductor substrate 100 may be removed from a surface 100a of the semiconductor substrate 100 by using, for example a photolithography process and an etching process to form holes extending towards a surface 100b which include, for example, a hole 117a and a hole 117b. In one embodiment, the hole 117a and the hole 117b may expose a conducting pad 106a and a conducting pad 106b, respectively.

Then, an insulating layer 118 may be formed on the surface 100a of the semiconductor substrate 100. The insulating layer 118 may be conformally formed on the semiconductor substrate 100, which may extend towards the surface 100b along, for example, sidewalls of the hole 117a and the hole 117b. In one embodiment, the insulating layer 118 may cover the conducting pad 106a and the conducting pad 106b at bottoms of the hole 117a and the hole 117b, respectively.

Figure 2C:
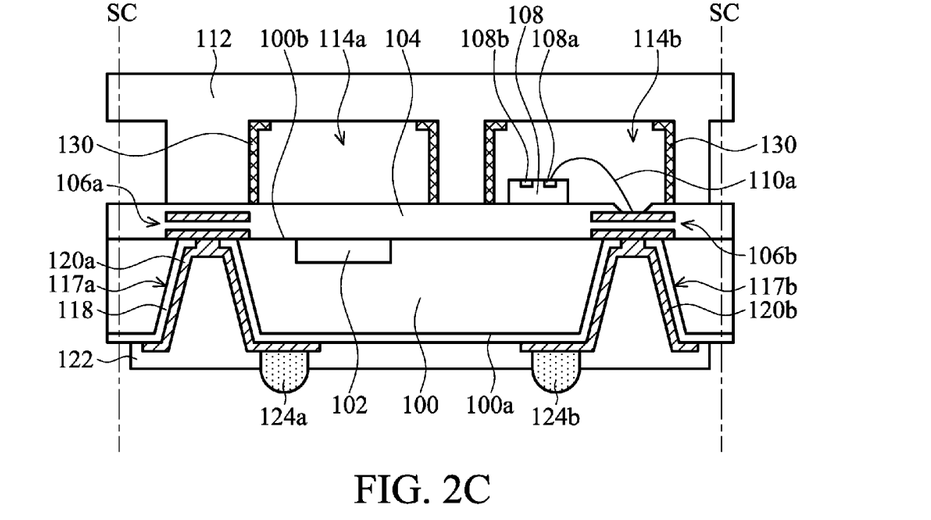

Next, as shown in FIG. 2C, the insulating layer 118 may be patterned to expose the conducting pad 106a and the conducting pad 106b. Then, wire layers may be formed on the insulating layer 118 on the surface of the semiconductor substrate 100, which include, for example, a wire layer 120a and a wire layer 120b. The wire layer 120a and the wire layer 120b may extend towards the surface 100b along the sidewalls of the hole 117a and the hole 117b and electrically contact with the conducting pad 106a and the conducting pad 106b, respectively.

Then, a protection layer 122 may be formed on the surface 100a of the semiconductor substrate 100, which has openings exposing the plurality of wire layers (such as the wire layer 120a and the wire layer 120b). In one embodiment, the protection layer 122 may not overlap with predetermined scribe lines SC. Conducting bumps may then be formed on the exposed wire layers, which include, for example, a conducting bump 124a and a conducting bump 124b. The conducting bump 124a may be electrically connected to the sensor region 102 through the wire layer 120a and the conducting pad 106a. The conducting bump 124b may be electrically connected to the light emitting device 108 through the wire layer 120b and the conducting pad 106b.

Figure 2D:
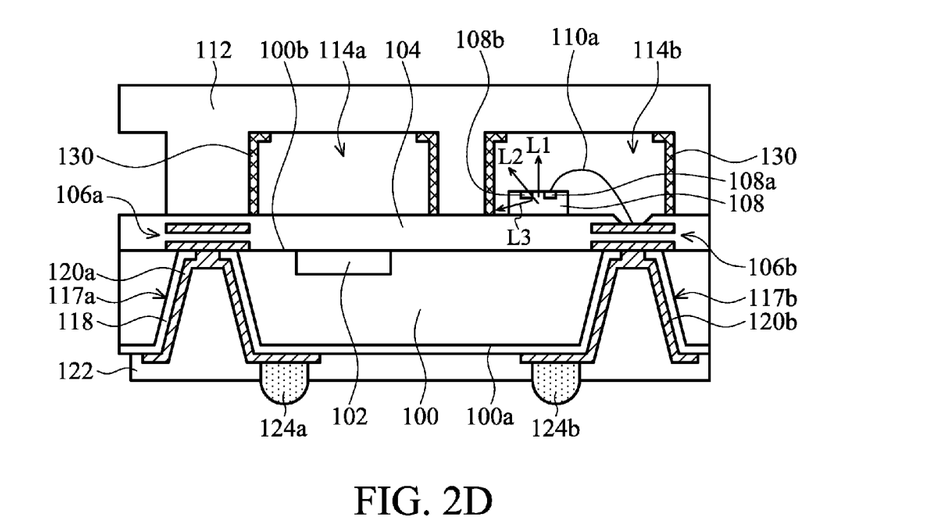

Next, as shown in FIG. 2D, a dicing process may be performed along the predetermined scribe lines SC of the semiconductor substrate 100 to form a plurality of chip packages separated from each other.

Embodiments of the present invention are not limited to those mentioned above and may have a variety of variations. For example, FIGS. 3A-3E are cross-sectional views respectively showing chip packages according to embodiments of the present invention, wherein same or similar reference numbers are used to designate same or similar elements.

Figure 3A:
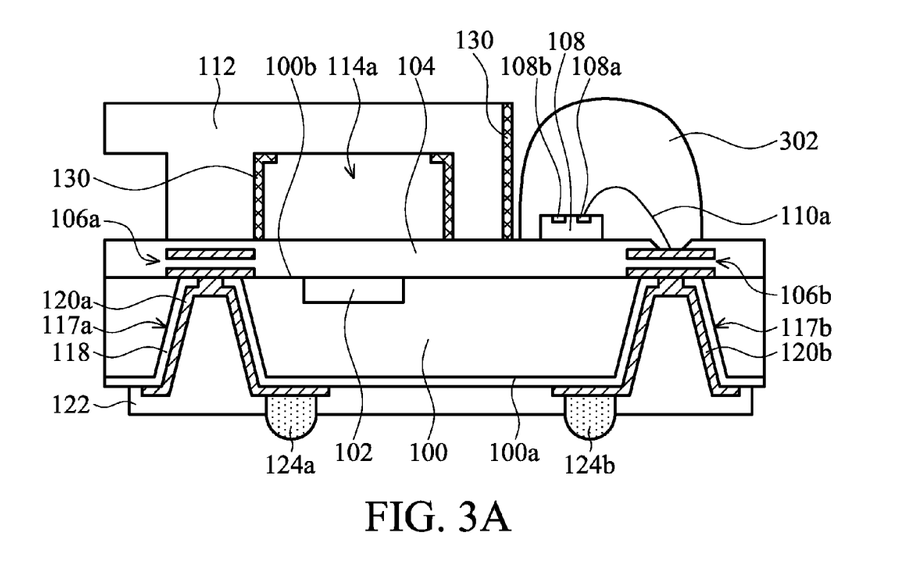
FIGS. 3A-3E are cross-sectional views showing chip packages according to embodiments of the present invention, respectively.

The embodiment shown in FIG. 3A is similar to the embodiment shown in FIG. 2D. In this embodiment, the transparent cover plate 112 does not cover the light emitting device 108. An optical glue 302 may be optionally disposed on the light emitting device 108. The optical glue 302 may surround the light emitting device 108. Similarly, the light shielding layer 130 may be formed on more surfaces of the transparent cover plate 112 to prevent the light emitted by the light emitting device 108 from forming noise. Any disposing manner of the light shielding layer which does not influence the sensor region 102 from receiving reflective light from an object which the chip package approaches is within the scope of the embodiment of the invention.

Figure 3B:
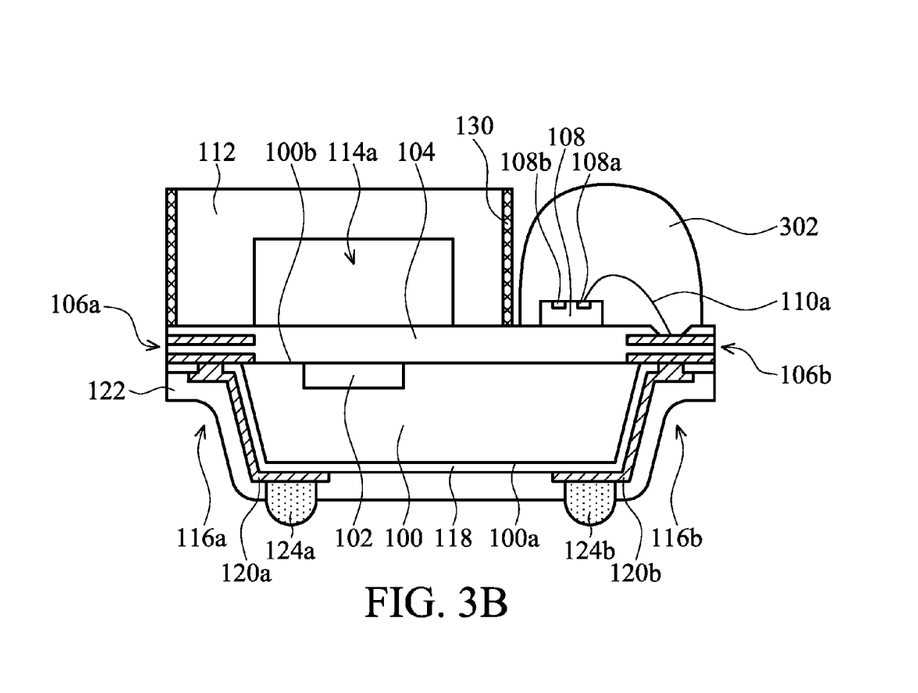

The embodiment shown in FIG. 3B is similar to the embodiment shown in FIG. 1D. Similarly, the transparent cover plate 112 may not cover the light emitting device 108, and the optical glue 302 may be optionally disposed on the light emitting device 108.

Figure 3C:
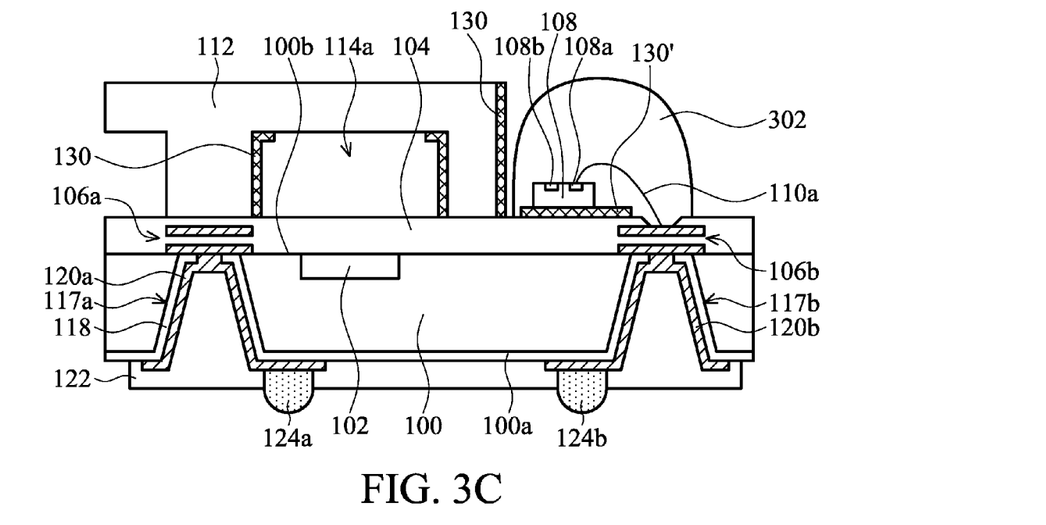

The embodiment shown in FIG. 3C is similar to the embodiment shown in FIG. 3A. In this embodiment, a light shielding layer 130' may be disposed on the surface 100a of the semiconductor substrate 100 in advance before the light emitting device 108 is disposed. Because the light shielding layer 130' is disposed between the semiconductor substrate 100 and the light emitting device 108, the light emitted by the light emitting device 108 and traveling towards the semiconductor substrate 100 may be prevented and/or reduced from reaching the sensor region 108 to cause noise due to reflection and/or diffraction.

Figure 3D:
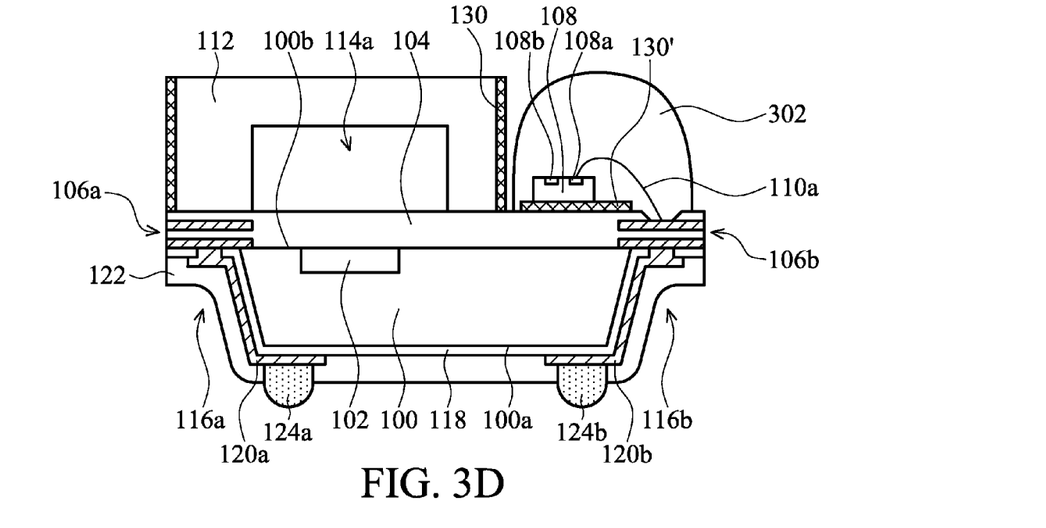

The embodiment shown in FIG. 3D is similar to the embodiment shown in FIG. 3B. In this embodiment, the light shielding layer 130' may also be disposed between the semiconductor substrate 100 and the light emitting device 108 to prevent and/or reduce the noise which may be caused by the light emitted by the light emitting device 108.

Figure 3E:
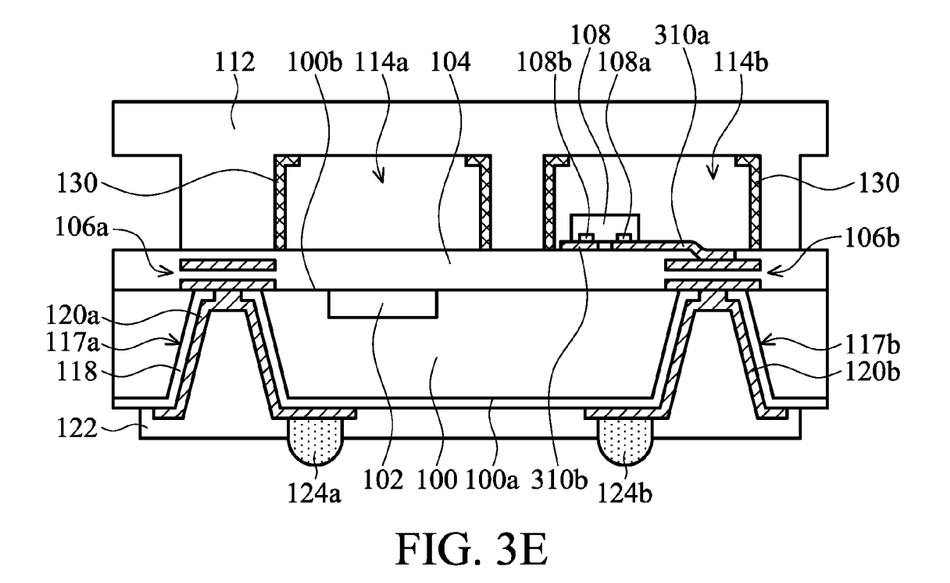

In the embodiment shown in FIG. 3E, the electrode 108a and the electrode 108b of the light emitting device 108 may be electrically connected to a distribution layer 310a and a distribution layer 310b, respectively. Thus, the electrode 108a may be electrically connected to the conducting bump 124b through the distribution layer 310a and the conducting pad 106b. Similarly, the electrode 108b may also be electrically connected to a corresponding conducting bump (not shown) in a similar manner.

In the embodiments of the invention, devices having multiple functionalities may be integrated in a same chip package, and the volume of the chip package and the number of pins may be significantly reduced. By using a wafer level packaging process to form a chip scale package, fabrication cost and time may be reduced, and a chip package having more functionalities and smaller volume may be obtained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate having a first surface and a second surface;
   a sensor region formed in the semiconductor substrate at the second surface;
   a light emitting device disposed over the second surface of the semiconductor substrate;
   at least one first conducting bump disposed on the first surface of the semiconductor substrate and electrically connected to the sensor region;
   at least one second conducting bump disposed on the first surface of the semiconductor substrate and electrically connected to the light emitting device; and
   an insulating layer located on the semiconductor substrate to electrically insulate the semiconductor substrate from the at least one first conducting bump and the at least one second conducting bump.

2. The chip package as claimed in claim 1, wherein the light emitting device comprises a light emitting diode.

3. The chip package as claimed in claim 1, wherein the sensor region comprises an image sensor.

4. The chip package as claimed in claim 1, further comprising:
   a dielectric layer disposed on the second surface of the semiconductor substrate, wherein the dielectric layer is located between the semiconductor substrate and the light emitting device;
   at least one first conducting pad disposed in the dielectric layer and electrically connected to the sensor region and the at least one first conducting bump; and
   at least one second conducting pad disposed in the dielectric layer and electrically connected to the light emitting device and the at least one second conducting bump.

5. The chip package as claimed in claim 4, further comprising:
   at least one first wire layer disposed on the insulating layer, wherein the at least one first wire layer is electrically connected to the at least one first conducting bump and the at least one first conducting pad; and
   at least one second wire layer disposed on the insulating layer, wherein the at least one second wire layer is electrically connected to the at least one second conducting bump and the at least one second conducting pad.

6. The chip package as claimed in claim 5, wherein the at least one first wire layer extends from the first surface towards the second surface of the semiconductor substrate along a side surface of the semiconductor substrate and electrically contacts with the at least one first conducting pad.

7. The chip package as claimed in claim 5, wherein the at least one second wire layer extends from the first surface towards the second surface of the semiconductor substrate along a side surface of the semiconductor substrate and electrically contacts with the at least one second conducting pad.

8. The chip package as claimed in claim 5, further comprising at least one first hole extending from the first surface towards the second surface of the semiconductor substrate, wherein the insulating layer extends on a sidewall of the at least one first hole, and the at least one first wire layer extends from the first surface towards the second surface of the semiconductor substrate along the sidewall of the at least one first hole to electrically contact with the at least one first conducting pad.

9. The chip package as claimed in claim 5, further comprising at least one second hole extending from the first surface towards the second surface of the semiconductor substrate, wherein the insulating layer extends on a sidewall of the at least one second hole, and the at least one second wire layer extends from the first surface towards the second surface of the semiconductor substrate along the sidewall of the at least one second hole to electrically contact with the at least one second conducting pad.

10. The chip package as claimed in claim 1, further comprising a transparent cover plate disposed on the second surface of the semiconductor substrate.

11. The chip package as claimed in claim 10, further comprising a light shielding layer disposed on a portion of a surface of the transparent cover plate, wherein the light shielding layer is located between the sensor region and a light directly emitted by the light emitting device.

12. The chip package as claimed in claim 10, wherein the transparent cover plate and the semiconductor substrate together surround at least two cavities, and the light emitting device is disposed in one of the at least two cavities.

13. The chip package as claimed in claim 10, wherein the transparent cover plate and the semiconductor substrate together surround at least one cavity, and the sensor region is located below the at least one cavity.

14. The chip package as claimed in claim 13, further comprising an optical glue disposed on the second surface of the semiconductor substrate and covering the light emitting device.

15. The chip package as claimed in claim 1, further comprising a light shielding layer disposed between the light emitting device and the second surface of the semiconductor substrate.

16. The chip package as claimed in claim 1, further comprising a protection layer disposed on the first surface of the semiconductor substrate and having at least two openings, wherein the at least one first conducting bump and the at least one second conducting bump are disposed in the at least two openings of the protection layer and protrude from the at least two openings, respectively.

17. A method for forming a chip package, comprising:
providing a semiconductor wafer having a first surface and a second surface, wherein a plurality of sensor regions are formed in the semiconductor wafer at the second surface;
disposing a plurality of light emitting devices over the second surface of the semiconductor wafer;
forming an insulating layer on the first surface of the semiconductor wafer;
forming a plurality of first conducting bumps on the insulating layer on the first surface of the semiconductor wafer, wherein each of the plurality of first conducting bumps is electrically connected to a corresponding one of the plurality of sensor regions;
forming a plurality of second conducting bumps on the insulating layer on the first surface of the semiconductor wafer, wherein each of the plurality of second conducting bumps is electrically connected to a corresponding one of the plurality of light emitting devices; and
separating a plurality of chip packages from each other, wherein each of the plurality of chip packages comprises at least one of the plurality of sensor regions and at least one of the plurality of light emitting devices.

18. The method for forming a chip package as claimed in claim 17, further comprising:
before the dicing process is performed, disposing a transparent cover plate on the second surface of the semiconductor wafer, wherein the transparent cover plate and the semiconductor wafer together surround a plurality of cavities, and each of the light emitting devices is disposed in a corresponding one of the plurality of cavities; and
when the dicing process is being performed, further dicing the transparent cover plate.

19. The method for forming a chip package as claimed in claim 18, further comprising forming a plurality of light shielding layers on a portion of a surface of the transparent cover plate before the dicing process is performed, wherein after the dicing process is performed, in each of the plurality of chip packages separated from each other, a corresponding one of the plurality of light shielding layers is located between a corresponding one of the plurality of sensor regions and a light is directly emitted by a corresponding one of the plurality of light emitting devices.

20. The method for forming a chip package as claimed in claim 17, further comprising disposing a plurality of light shielding layers on the second surface of the semiconductor substrate before the plurality of light emitting devices are disposed and subsequently disposing the plurality of light emitting devices on the plurality of light shielding layers, respectively.

* * * * *